United States Patent
Shim (10) Patent No.: US 7,262,638 B2
(45) Date of Patent: *Aug. 28, 2007

(54) CURRENT SENSE AMPLIFIER

(75) Inventor: Jae-Yoon Shim, Suwon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/989,274

(22) Filed: Nov. 17, 2004

(65) Prior Publication Data

US 2005/0062504 A1     Mar. 24, 2005

Related U.S. Application Data

(62) Division of application No. 10/377,656, filed on Mar. 4, 2003, now Pat. No. 6,836,155.

(30) Foreign Application Priority Data

Mar. 19, 2002   (KR) ............................... 2002-14814

(51) Int. Cl.
*G01R 19/00* (2006.01)
(52) U.S. Cl. .......................................... 327/55; 327/54
(58) Field of Classification Search ............. 327/51–57
See application file for complete search history.

(56) References Cited

U.S. PATENT DOCUMENTS

| | | | | |
|---|---|---|---|---|
| 5,668,495 | A * | 9/1997 | Vora et al. | 327/432 |
| 6,411,559 | B1 * | 6/2002 | Yokozeki | 365/205 |
| 6,483,353 | B2 * | 11/2002 | Kim et al. | 327/55 |
| 6,836,155 | B2 * | 12/2004 | Shim | 327/55 |

* cited by examiner

*Primary Examiner*—Kenneth B. Wells
(74) *Attorney, Agent, or Firm*—Harness, Dickey & Pierce, P.L.C.

(57) ABSTRACT

A current sense amplifier includes a pair of cross-coupled transistors, each transistor being connected between a respective input signal line and a respective output signal generating node, for amplifying voltage difference between the output signal generating nodes. Additionally, the current sense amplifier may include a constant current circuit connected between the output signal generating nodes and a common node for allowing current to flow between the common node and the output signal generating nodes in response to a bias voltage; and a voltage generating circuit for causing a voltage difference between the output signal generating nodes by being turned on in response to a respective output signal.

8 Claims, 4 Drawing Sheets

CURRENT SENSE AMPLIFIER

CROSS REFERENCE TO RELATED APPLICATIONS AND PRIORITY STATEMENT

This U.S. nonprovisional patent application claims priority under 35 U.S.C. §119 to Korean Patent Application 2002-14814, filed on Mar. 19, 2002, the entire contents of which are hereby incorporated by reference. This application is a divisional application of and claims priority under 35 U.S.C. §120 to U.S. patent application Ser. No: 10/377,656, filed Mar. 4, 2003, now U.S. Pat. No. 6,836,155.

BACKGROUND OF INVENTION

1. Field of the Invention

The present invention relates to a current sense amplifier capable of being operated in a stable manner at a low power voltage.

2. Description of the Related Art

In general, a current sense amplifier has an advantage over a voltage sense amplifier, since it operates at a higher speed, as compared to the voltage sense amplifier. Thus, the current sense amplifier can sense and amplify even small amounts of current. Accordingly, current sense amplifiers are often used in high-speed semiconductor devices. However, a common problem with the current sense amplifier is that it typically malfunctions at low power voltages (e.g., lower than power supply voltages used for normal operations).

Figure 1:
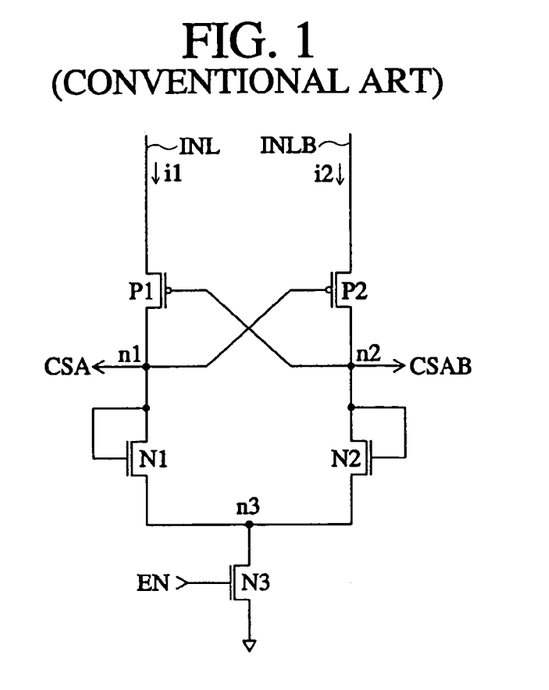
FIG. 1 illustrates a circuit diagram of a conventional current sense amplifier.

FIG. 1 illustrates a circuit diagram of a conventional current sense amplifier As shown in FIG. 1, the conventional current sense amplifier contains a first PMOS input transistor P1 and a second PMOS input transistor P2. Each PMOS input transistor P1 and P2 has a source connected to an input signal line of a pair of input signal lines INL, INLB, a gate and a drain cross-coupled to the drain and the gate of the other PMOS transistor P1 or P2, respectively. References INL and INLB designate an input signal line and a complementary input signal line, respectively. The drains of the first and second PMOS transistors P1 and P2 are connected to first and second nodes n1 and n2, where an output signal CSA and a complementary output signal CSAB are respectively output.

The conventional sense amplifier further includes a first NMOS transistor N1 and a second NMOS transistor N2, each with a drain connected to the first node n1 and the second node n2, respectively, each with a gate coupled to its own drain, and each NMOS transistor having a source coupled to a common node n3. The current sense amplifier further includes a third NMOS transistor N3 with a drain connected to the common node n3, a gate receiving an enabling signal EN and a source connected to a ground voltage.

Operation of the conventional sense amplifier shown in FIG. 1 is described below. In operation, the conventional sense amplifier assumes that current i1 of the input signal line INL is slightly greater than current i2 of the complementary input signal line INLB. When an enabling signal (EN) with logic "high" level is applied to the gate of the third NMOS transistor N3, the third NMOS transistor N3 is turned on and the common node n3 becomes the ground voltage.

When voltage differences between the common node n3 and the first node n1, and between the common node n3 and the second node n2, are greater than threshold voltages of the first and second NMOS transistors N1, N2, respectively, and when voltage differences between the input signal line INL and the first node n1 and between the complementary input signal line INLB and the second node n2 are greater than threshold voltages of the first and second PMOS transistors P1, P2, respectively, the PMOS transistors P1 and P2 are turned on. Accordingly, the currents i1, i2 flow to NMOS transistors N1 and N2 via PMOS transistors P1 and P2, respectively.

At this time, voltage at the first node n1 is greater than voltage at the second node n2, because the current i1 of the input signal line INL is greater than the current i2 of the complementary input signal line INLB, and since resistance of the NMOS transistors N1 and N2 are the same. Therefore, resistance of the second PMOS transistor P2 becomes greater than resistance of the first PMOS transistor P1. As a result, a voltage difference between the first node n1 and second node n2 occurs. That is, voltage of the second node n2 is greater than voltage of the first node n1. However, this voltage difference value is small.

Operation of the circuit in FIG. 1 in which the current i1 is less than the current i2 is now described. When the enable signal (EN) having a "high" logic level is applied to the gate of the third NMOS transistor N3, the common node n3 becomes the ground voltage. Then, if voltage differences between the common node n3 and each of the first and the second nodes n1, n2, respectively, are greater than threshold voltages of the first and second NMOS transistors N1, N2, respectively, and if voltage differences between the input signal line INL and the first node n1 and between the complementary input signal line INLB and the second node n2 are greater than threshold voltages of the first and second PMOS transistors P1, P2, respectively, the PMOS transistors P1 and P2 are turned on. Accordingly, currents i1, i2 flow to the NMOS transistors N1 and N2 via PMOS transistors P1 and P2, respectively.

At this time, voltage at the first node n1 is less than voltage at the second node n2 because the current i1 on the input signal line INL is less than the current i2 on the complementary input signal line INLB, and resistance of the NMOS transistors N1 and N2 are the same. Therefore, resistance of the first PMOS transistor P1 becomes greater than resistance of the second PMOS transistor P2. As a result, a voltage difference between the first node n1 and the second node n2 occurs. That is, voltage of the second node n2 is greater than the first node n1. However, this voltage difference value is also small.

The conventional current sense amplifier circuit of FIG. 1 senses small amounts of current on the pair of the input signal lines INL, INLB, and generates a pair of output signals CSA, CSAB, each having a different voltage level. The current sense amplifier in FIG. 1 may be operated normally if the voltage of each of the input signal lines INL and INLB is greater than a total threshold voltage of the first PMOS transistor P1 and the second NMOS transistor N2, and greater than a total threshold voltage of the second PMOS transistor P2 and the first NMOS transistor N1. For example, if the threshold voltage of the PMOS transistors P1, P2 and the NMOS transistors N1, N2 is 0.8 V, respectively, the current sense amplifier in FIG. 1 may be normally operated when the voltage level of the input signal lines INL, INLB is greater than 1.6 V. In other words, if the voltage level of the input signal lines INL, INLB is less than 1.6 V, the current sense amplifier in FIG. 1 may not operate normally.

Therefore, the current sense amplifier of FIG. 1 may not be utilized for a semiconductor memory device that operates at a low power supply voltage (e.g., less than 1.6 V, for example). As the power supply voltage decreases to below 1.6 V, voltages of the input signal lines INL, INLB also decrease. However, threshold voltages of the PMOS and NMOS transistors should also decrease, for the current sense amplifier of FIG. 1 to be operated normally In practice, however, it is difficult to reduce the threshold voltage of the transistors.

SUMMARY OF THE INVENTION

Exemplary embodiments of the present invention provide a current sense amplifier capable of being operated normally in low voltage semiconductor devices (devices operated at a voltage less than 1.6 V). An exemplary embodiment is directed to a current sense amplifier that includes a pair of cross-coupled transistors, each transistor being connected between a respective input signal line and a respective output signal generating node, for amplifying voltage difference between the output signal generating nodes. Additionally, the current sense amplifier may include a constant current circuit connected between the output signal generating nodes and a common node for allowing current to flow between the common node and the output signal generating nodes in response to a bias voltage; and a voltage generating circuit for causing a voltage difference between the output signal generating nodes by being turned on in response to a respective output signal.

In another exemplary embodiment, there is a current sense amplifier that includes a pair of cross-coupled transistors, each transistor being connected between a respective input signal line of a pair of input signal lines, and a respective output signal generating node of a pair of output signal generating nodes, for amplifying a voltage difference between the output signal generating nodes. The current sense amplifier may also include a constant current circuit connected between the output signal generating nodes and a common node for allowing current to flow to the common node from the output signal generating nodes in response to a bias voltage; and a voltage generating circuit connected between the output signal generating nodes and a power supply voltage for causing a voltage difference between the output signal generating nodes. The voltage difference may be caused by the turning on of the voltage generating circuit in response to a respective output signal of a pair of output signals.

A ground voltage may be applied to the common node, and the current sense amplifier may further include an enabling circuit for transmitting the ground voltage to the common node by being turned on in response to an enable signal. The voltage generating circuit may further comprise a first PMOS transistor with a source connected to the power supply voltage, a gate and a drain, both gate and drain connected to one of the output signal generating nodes; and a second PMOS transistor with a source connected to the power supply voltage, a gate and a drain, both gate and drain being connected to the other of the pair of output signal generating nodes.

In another exemplary embodiment, a current sense amplifier may include the above-described pair of cross-coupled transistors and constant current circuit, but with a different voltage generating circuit. The voltage generating circuit in this exemplary embodiment may be connected between the respective input signal line and the respective output signal generating node for causing a voltage difference between the output signal generating nodes by being turned on in response to a respective output signal of a pair of output signals.

In another exemplary embodiment, a current sense amplifier may include the above-described pair of cross-coupled transistors and constant current circuit as described in the previous exemplary embodiments, but with still a different voltage generating circuit. In particular, the current sense amplifier may include a first voltage generating circuit and a second voltage generating circuit.

The first voltage generating circuit may be connected between a respective output signal generating node and a power supply voltage, for causing a voltage difference between the pair of output signal generating nodes by being turned on in response to a respective output signal of a pair of output signals. The second voltage generating circuit may be connected between a respective input signal line and a respective output signal generating node for causing a voltage difference between the pair of output signal generating nodes by being turned on in response to a respective output signal of the pair of output signals.

The first voltage generating circuit may include a first PMOS transistor with a source connected to the power supply voltage, a gate and a drain, both gate and drain being connected to one of the output signal generating nodes; and a second PMOS transistor with a source connected to the power supply voltage, a gate and a drain, both gate and drain being connected to the other output signal generating node of the pair.

The second voltage generating circuit may include a first PMOS transistor with a source connected to one of the input signal lines, a gate and a drain, both gate and drain being connected to one of the output signal generating nodes; and a second PMOS transistor with a source connected to the other input signal line, a gate and a drain, both gate and drain being connected to the other output signal generating node of the pair.

In another exemplary embodiment, and in additional to the aforementioned pair of cross-coupled transistors and constant current circuit, the current sense amplifier may further include first, second and third voltage generating circuits. The first voltage generating circuit may be connected between the respective output signal generating nodes and a common node, and the second voltage generating circuit may be connected between a power supply voltage and the respective output signal generating nodes (similar to the first voltage generating circuit in the previous exemplary embodiment).

The third voltage generating circuit may be connected between a respective input signal line and a respective output signal generating node for causing a voltage difference between the pair of output signal generating nodes by being turned on in response to a respective output signal of the pair of output signals.

The third voltage generating circuit may include a first NMOS transistor with a source connected to the common node, a drain and a gate, both gate and drain being connected to one of the output signal generating nodes; and a second NMOS transistor with a source connected to the common node, a gate and a drain, both gate and drain being connected to the other output signal generating node.

In another exemplary embodiment, the current sense amplifier may further include first and second voltage amplifying circuits. The first voltage amplifying circuit may be connected between one of the input signal lines and the common node for amplifying a signal of one of the output signal generating nodes. A trigger voltage of the first voltage amplifying circuit may be changed in response to voltage of the output signal generating node.

The second voltage amplifying circuit may be connected between one of the input signal lines and the common node for amplifying a signal of the other output signal generating node of the pair. A trigger voltage of the second voltage amplifying circuit may be changed in response to voltage of the other output signal generating node.

BRIEF DESCRIPTION OF THE DRAWINGS

For a more complete understanding of the exemplary embodiments of the present invention and the advantages thereof, reference is now made to the following descriptions taken in conjunction with the accompanying drawings, in which like reference numerals denote like parts, and in which.

DETAILED DESCRIPTION OF THE EXEMPLARY EMBODIMENTS

Figure 2:
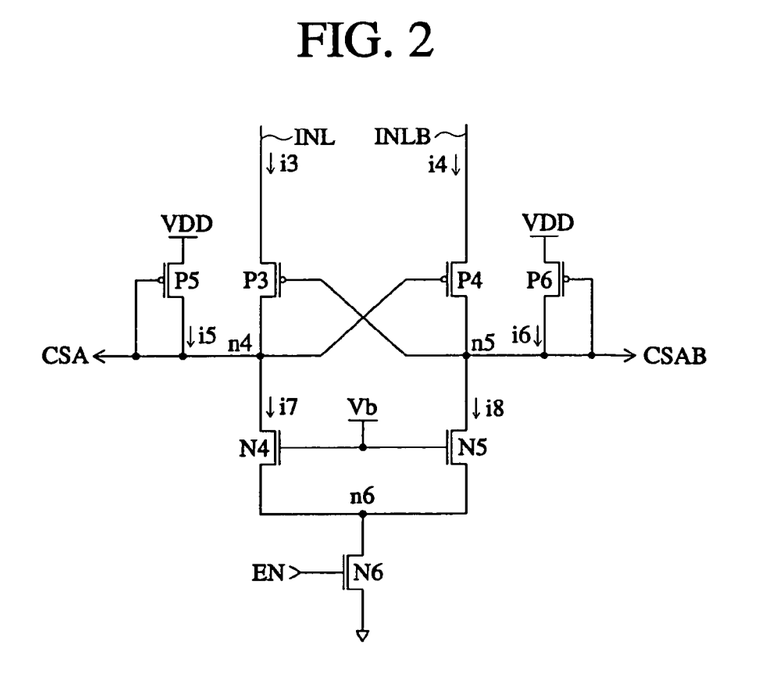
FIG. 2 illustrates a circuit diagram of a current sense amplifier in accordance with an exemplary embodiment of the present invention.

FIG. 2 is a circuit diagram of a current sense amplifier in accordance with an exemplary embodiment of the present invention. As shown in FIG. 2, the current sense amplifier contains PMOS transistors P3, P4, P5 and P6 and NMOS transistors N4, N5 and N6.

PMOS transistor P3 includes a source connected to an input signal line INL, a drain connected to a first node n4 and a gate connected to a second node n5. PMOS transistor P4 includes a source connected to a complementary input signal line INLB, a drain connected to the second node n5 and a gate connected to the first node n4. The drain and gate of one PMOS transistors P3 or P4 is cross-coupled to the gate and drain of the other PMOS transistors P3 or P4, as shown in FIG. 2.

PMOS transistor P5 includes a source connected to a power supply voltage VDD, a gate and a drain, both being connected to first node n4, where an output signal CSA is output. PMOS transistor P6 comprises a source connected to the power supply voltage VDD, a gate and a drain, both being connected to the second node n5 where a complementary output signal CSAB is output.

NMOS transistor N4 includes a drain connected to the first node n4, a gate receiving a bias voltage Vb and a source connected to a common node n6. NMOS transistor N5 includes a drain connected to the second node n5, a gate receiving the bias voltage Vb and a source connected to the common node n6. NMOS transistor N6 includes a drain connected to the common node n6, a gate receiving an enable signal (EN) and a source connected to ground voltage.

In FIG. 2, references i3, i4, i5, i6, i7 and i8 denote currents flowing through the PMOS transistors P3, P4, P5 and P6 and NMOS transistors N4 and N5, respectively. Operation of the circuit in FIG. 2 is now described.

In operation, the current i3 is greater than the current i4 when the enable signal EN with a logic "high" level is input to the gate of the NMOS transistor N6. In response to the enable signal with a logic "high" level, NMOS transistor N6 is turned on and the common node n6 becomes the ground voltage. PMOS transistor P3 is turned on when voltage difference between the input signal line INL and the first node n4 is greater than a threshold voltage of PMOS transistor P3. Further, PMOS transistor P4 is turned on when voltage difference between the input signal line INLB and the second node n5 is greater than a threshold voltage of PMOS transistor P4.

PMOS transistors P5 and P6 are turned on when voltage differences between the power supply voltage VDD and each of the nodes n4 and n5 are greater than threshold voltages of the PMOS transistors P5 and P6, respectively. The NMOS transistors N4 and N5 are turned on when voltage differences between the node n4 and the common node n6, and between the node n5 and the common node n6, are greater than a given voltage, i.e., 0.2 V to 0.3 V, and operated in a saturation area. Where the NMOS transistors N4 and N5 have the same size, the currents i7 and i8 flowing through the NMOS transistors N4 and N5, respectively, are equal, too.

Therefore, the current i5 flowing through PMOS transistor P5 becomes greater than the current i6 flowing through the PMOS transistor P6, since currents i7 and i8 are equal, and since current i3 flowing through PMOS transistor P3 is greater than current i4 flowing through PMOS transistor P4. Voltages at nodes n4 and n5 are proportional to resistances of the PMOS transistors P5 and P6, and the currents i5 and i6, respectively. Accordingly, voltage at node n4 is greater than voltage at node n5. Thus, a relatively larger amount of current flows through PMOS transistor P3, as compared to the current through PMOS transistor P4. Accordingly, a voltage difference between the nodes n4 and n5 becomes greater. The flowing current stops when a voltage difference between node n4 and node n5 reaches a desired level.

On the other hand, the same operation may be performed in the current sense amplifier of FIG. 2 as the enable signal (EN) with logic "high" level is input to the current sense amplifier circuit of FIG. 2, even when current i4 is greater than current i3.

In FIG. 2, the current sense amplifier may be operated in normal when voltage of the input signal line INL is greater than a sum of the threshold voltage of PMOS transistor P3 and a voltage difference between the drain and source of the NMOS transistor N4, and when voltage of the input signal line INLB is greater than a sum of the threshold voltage of PMOS transistor P4 and the voltage difference between the drain and source of the NMOS transistor N5. For example, if the threshold voltage of PMOS transistors P3 and P4 is 0.8 V, and the voltage difference between the drain and source of the respective NMOS transistors N4 and N5 is 0.2 V and 0.3 V, respectively, the current sense amplifier in FIG. 2 operates in normal at a voltage ranging from 1.0 V to 1.1 V of the input signal lines INL and INLB. Accordingly, the current sense amplifier in FIG. 2 may be operated at a relatively low power voltage, as compared to the conventional current sense amplifier.

Figure 3:
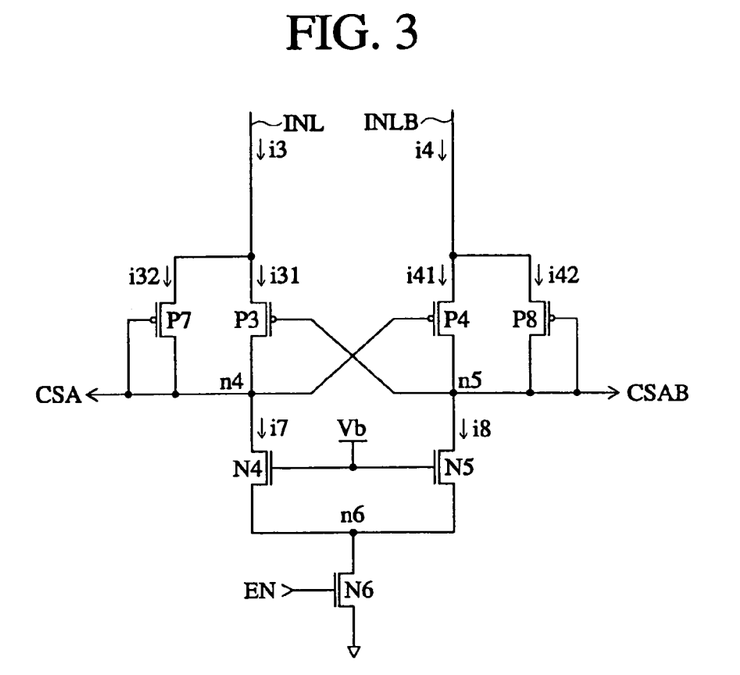
FIG. 3 illustrates a circuit diagram of a current sense amplifier in accordance with another exemplary embodiment of the present invention.

FIG. 3 is a circuit diagram of a current sense amplifier in accordance with another exemplary embodiment of the present invention. The current sense amplifier contains many of the elements described to FIG. 2, except for differences related to PMOS transistors P5 and P6. Accordingly, duplicate circuit configuration or duplicate components from FIG. 2 are not explained in detail for the sake of convenience.

PMOS transistors P7 and P8 replace PMOS transistors P5 and P6 in the current sense amplifier of FIG. 3. PMOS transistor P7 includes a source connected to the source of PMOS transistor P3 and input signal INL, and a gate and drain, both being connected to node n4. Therefore, PMOS transistor P7 differs from PMOS transistor P5 solely in its source connection, since PMOS transistor P5 has its source connected to the power supply voltage VDD. PMOS transistor P8 includes a source connected to the complementary input signal line INLB, a gate and drain, both being connected to node n5. Therefore, PMOS transistor P8 differs from PMOS transistor P6 only in its source connection, since the source of PMOS transistor P6 is connected to the power supply voltage VDD.

The currents i3, i4, i7 and i8 denote the same currents as in FIG. 2. The currents i31, i41 denote currents flowing through the PMOS transistors P3, P4, respectively. The currents i41, i42 denote currents flowing through PMOS transistors P7 and P8.

Operation of the current sense amplifier in FIG. 3 is similar to the operation of the circuit in FIG. 2. However, voltage levels of nodes n4 and n5 in FIG. 3 are lower than the voltage levels of nodes n4 and n5 in FIG. 2, respectively, because the sources of the PMOS transistors P7 and P8 are connected to the input signal lines INL and INLB. Input signal lines INL and INLB have lower voltage levels than the power supply voltage VDD. Thus, the voltage difference between nodes n4 and n5 in the circuit of FIG. 3 is greater than the voltage difference between the nodes n4 and n5 in the circuit of FIG. 2. That is, the voltage difference of output signals CSA, CSAB of the current sense amplifier in FIG. 3 is greater than the voltage difference of the output signals CSA, CSAB in the current sense amplifier of FIG. 2. In other words, gain of the current sense amplifier of FIG. 3 is greater than gain of the current sense amplifier of FIG. 2. Accordingly, the current sense amplifier of FIG. 3 may be operated normally with a low input signal line voltage, as does the current sense amplifier of FIG. 2.

Figure 4:
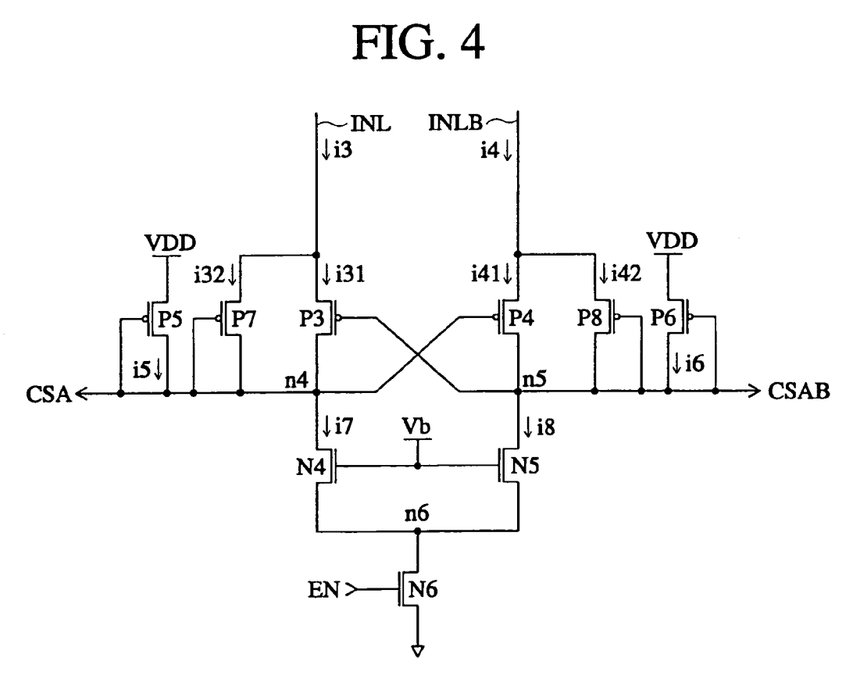
FIG. 4 illustrates a circuit diagram of a current sense amplifier in accordance with another exemplary embodiment of the present invention.

FIG. 4 is a circuit diagram of a current sense amplifier in accordance with another exemplary embodiment of the present invention. The current sense amplifier of FIG. 4 contains all elements of the current sense amplifier in FIG. 3, and additionally contains PMOS transistors P5 and P6, each connected as previously described in FIG. 2. PMOS transistors P5, P6, P7 and P8 in FIG. 4 are designed to be half the size of, e.g., take up about 50% of the space as do the PMOS transistors P5, P6, P7 and P8 described in FIGS. 2 and 3.

Operation of the circuit in FIG. 4 is the same as operation of the circuit in FIG. 2, but the voltage levels of nodes n4 and n5 in FIG. 4 are different from the voltage levels of nodes n4 and n5 in FIG. 2. This is due to PMOS transistors P7, P8. PMOS transistors P5 and P6, each with a source connected to a power supply voltage, step up the voltage of the nodes n4 and n5, while the PMOS transistors P7 and P8, each with a source connected to an input signal line, step down the voltage of nodes n4 and n5. Accordingly, voltage levels of nodes n4 and n5 in FIG. 4 are greater than the voltages of the nodes n4 and n5 in FIG. 3, respectively, but less than the voltages of nodes n4 and n5 in FIG. 2, respectively. Accordingly, the voltage difference between nodes n4 and n5 in FIG. 4 is also greater than the voltage difference between nodes n4 and n5 in FIG. 3, but less than the voltage difference between nodes n4 and n5 in FIG. 2.

As a result, a voltage difference between the pair of output signals CSA, CSAB in FIG. 4 is also greater than the voltage difference between the pair of output signals CSA, CSAB in FIG. 3, but less than the voltage difference in FIG. 2. Thus, voltage gain of the circuit in FIG. 4 is greater than the gain of the circuit in FIG. 2, but less than the gain of the circuit in FIG. 3. The current sense amplifier of FIG. 4 may be operated normally with a low input signal line voltage, as does the current sense amplifiers of FIG. 2 and FIG. 3.

Figure 5:
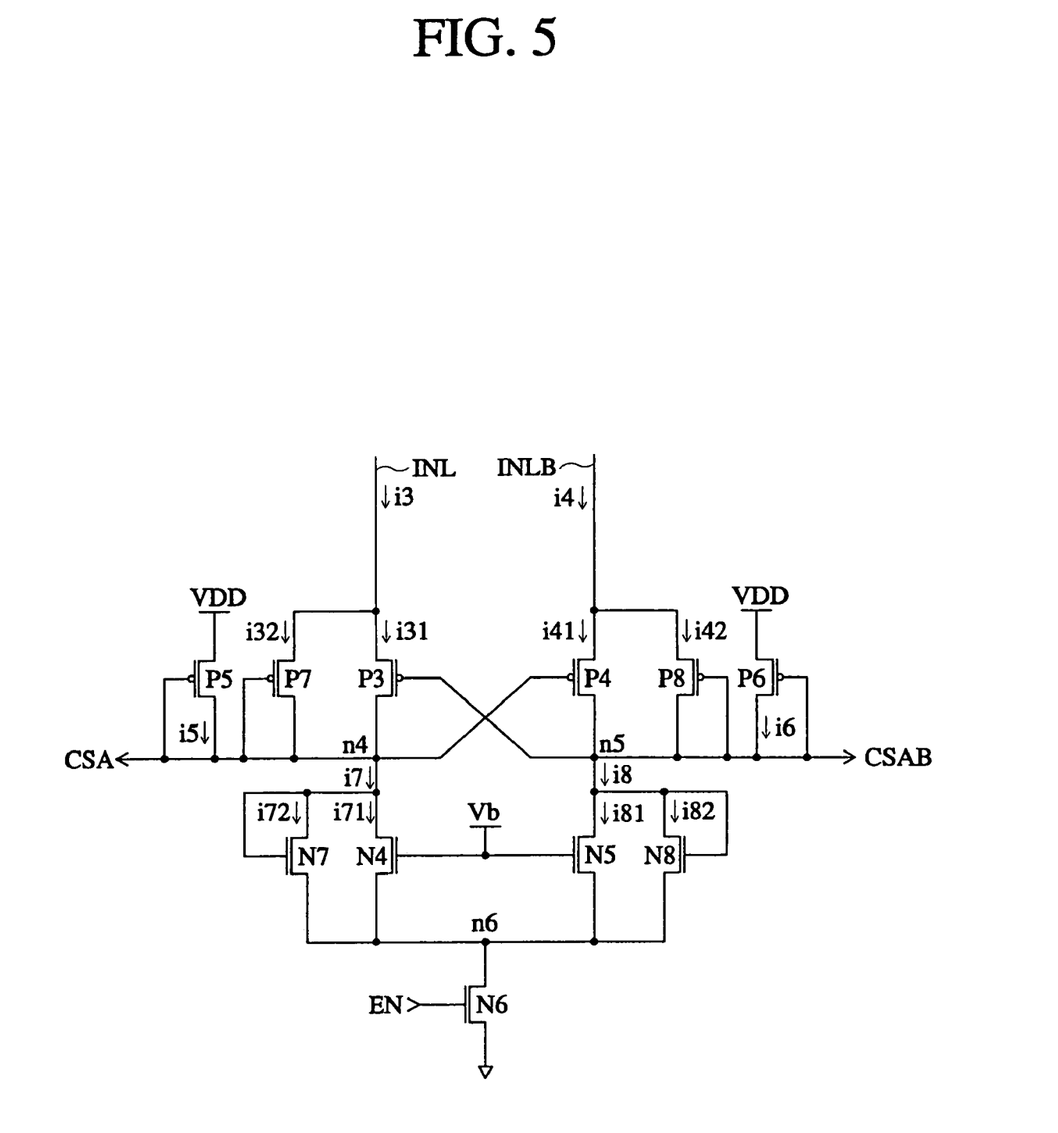
FIG. 5 illustrates a circuit diagram of a current sense amplifier in accordance with another exemplary embodiment of the present invention.

FIG. 5 is a circuit diagram of a sense amplifier in accordance with another exemplary embodiment of the present invention. This embodiment is configured to add NMOS transistors N7 and N8 to the circuit of FIG. 4.

As shown in FIG. 5, the NMOS transistor N7 may include a drain and a gate, both being connected to node n4, and a source connected to common node n6. The NMOS transistor N8 may include a drain and a gate, both being connected to node n5, and a source connected to common node n6. The currents i71 and i81 denote currents flowing through NMOS transistors N4 and N5, respectively. The currents i72 and i82 denote the currents flowing through the NMOS transistors N7 and N8, as shown in FIG. 5.

Operation of the circuit in FIG. 5 is similar to the circuit of FIG. 4. However, the circuit of FIG. 5 has additional functions, due to NMOS transistors N7 and N8. When voltages of input signal lines INL and INLB are greater than a predetermined voltage, NMOS transistors N7 and N8 are turned on, and a variation in currents i7, i8, which could be caused by the bias voltage Vb, could be offset. However, when voltages of the input signal lines INL, INLB are lower than the predetermined voltage, operation of the circuit of FIG. 5 is the same as the circuit in FIG. 4.

Figure 6:
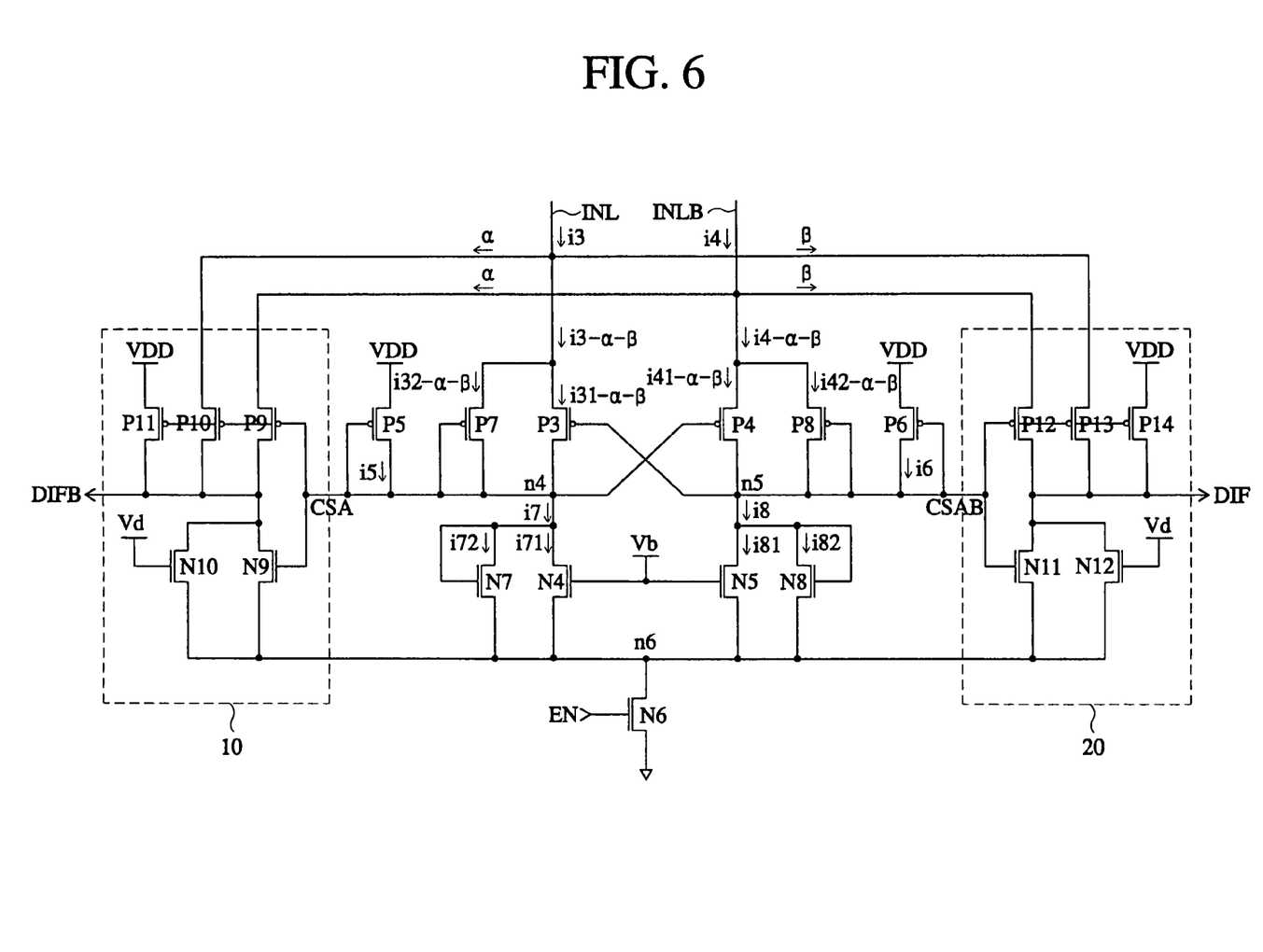
FIG. 6 illustrates a circuit diagram of a current sense amplifier in accordance with another exemplary embodiment of the present invention.

FIG. 6 is a circuit diagram of a current sense amplifier in accordance with another exemplary embodiment of the present invention. The current sense amplifier in this embodiment may include PMOS transistors P9-P14 and NMOS transistors N9-N12, in addition to the components of the circuit in FIG. 5. A first circuit 10 may include PMOS transistors P9-P11 and NMOS transistors N9 and N10, and a second circuit 20 may include PMOS transistors P12-P14 and NMOS transistors N11 and N12.

In first circuit 10, PMOS transistors P9-P11 and NMOS transistors N9 and N10 may be configured in the same way as PMOS transistors P3, P7 and P5 and NMOS transistors N4 and N7. However, the physical size of each of the PMOS transistors P9-P11 and NMOS transistors N9 and N10 within first circuit 10 is relatively smaller than that of corresponding PMOS transistors P3, P7 and P5 and NMOS transistors N4 and N7. The difference in sizes may be configured in a desired proportion, for example.

In second circuit 20, PMOS transistors P12-P14 and NMOS transistors N11, N12 may be configured in the same way as PMOS transistors P4, P8 and P6 and NMOS transistors N5 and N8. Similarly to the above, the physical size of each of the PMOS transistors P12-P14 and NMOS transistors N11 and N12 is relatively smaller than that of corresponding PMOS transistors P4, P8 and P6 and NMOS transistors N5 and N8, by a desired proportion, for example.

In circuits 10 and 20, a reference Vd denotes a drain voltage. In circuits 10 and 20, the sources of PMOS transistors P9 and P12 may be connected to the input signal line INL and the complementary input signal line INLB, respectively. Currents i3, i4, i5, i6, i7 and i8 in FIG. 6 denote the same currents as in FIG. 5. Reference numeral α denotes a current being applied to the first circuit 10, and reference numeral β denotes a current being applied to the second circuit 20.

In operation, currents i3 and i4 are flowing through input signal line INL and complementary input signal line INLB. Partial currents α and β of the currents i3 and i4 are flowing to the first circuit 10 and the second circuit 20. Currents i3-α-β and i4-α-β are flowing to the current sense amplifier. Currents i31-α-β and i41-α-β are flowing through PMOS transistors P3 and P4, respectively. Further, currents i32-α-β and i42-α-β are flowing through PMOS transistors P7 and P8, as shown in FIG. 6.

A current difference i3-i4, between the current i3-α-β and the current i4-α-β, is the same through the sense amplifier. Therefore, a voltage difference of the output signals CSA, CSAB is the same as the current difference, since the voltage is proportional to the current (e.g., same resistance).

When output signal CSA is generated from the current sense amplifier, the first circuit 10 inverts and amplifies the output signal CSA by driving inverters (formed by the PMOS transistors P9, P10 and P11 and NMOS transistors N9 and N10), thereby outputting an output signal DIFB having a first logic level. Like first circuit 10, the second circuit 20 inverts and amplifies the complementary output signal CSAB by driving inverters (formed by PMOS transistors P12, P13 and P14 and NMOS transistors N11 and N12), thereby outputting an output signal DIF having a second logic level.

At this time, a trigger voltage of the first circuit 10 may be varied in response to the voltage of the output signal CSA, since the sources of PMOS transistors P9 and P10 are connected to input signal lines INL and INLB, as shown in FIG. 6. Accordingly, the first circuit 10 may generate the output signal DIF by inverting and amplifying the voltage level of the output signal CSA.

Similarly, a trigger voltage of the second circuit 20 may be varied in response to the voltage level of the complementary output signal CSAB, since the sources of the PMOS transistors P12 and P13 are connected to the input signal lines INL and INLB, respectively. Thus, the second circuit 20 may generate the output signal DIFB by inverting and amplifying the voltage level of the complementary output signal CSAB.

Therefore, the first circuit 10 and second circuit 20 may amplify voltage of output signals CSA and CSAB in the current sense amplifier, so that an additional voltage sense amplifier is not required.

While the present invention has been particularly shown and described with reference to exemplary embodiments thereof, it will be understood by those skilled in the art that various changes in form and details may be made therein without departing from the spirit and scope of the invention, as defined by the appended claims.

What is claimed is:

1. A current sense amplifier, comprising:
    a pair of cross-coupled transistors, a first transistor of the pair being connected between a first input signal line and a first output signal generating node and responding to an output signal of a second output signal generating node, a gate of the first transistor connected to the second output signal generating node, and a second transistor of the pair being connected between a second input signal line and a second output signal generating node, a gate of the second transistor connected to the first output signal generating node and responding to an output signal of the first output signal generating node, for amplifying a voltage difference between the first output signal generating node and the second output signal generating node;
    a constant current circuit connected between the output signal generating nodes and a common node for allowing current to flow between the common node and the first output signal generating node and between the common node and the second output signal generating node in response to a bias voltage;
    an enabling circuit for transmitting a first power voltage to the common node by being turned on in response to an enable signal; and
    a voltage generating circuit for increasing a voltage difference between the first output signal generating node and the second output signal generating node generated by the pair of cross-coupled transistors by being turned on in response to respective output signals of the first output signal generating node and the second output signal generating node,
    wherein the voltage generating circuit comprises a third transistor being connected between a second power voltage and the first output signal generating node, a gate of the third transistor directly connected to the first output signal generating node, and responding to the output signal of the first output signal generating node, and a fourth transistor being connected between the second power voltage and the second output signal generating node, a gate of the fourth transistor directly connected to the second output signal generating node, and responding to the output signal of the second output signal generating node.

2. The current sense amplifier according to claim 1, wherein the voltage generating circuit further comprises:
    a fifth transistor being connected between the first input signal line and the first output signal generating node, a gate of the fifth transistor connected to the first signal generating node, and responding to the output signal of the first output signal generating node, and a sixth transistor being connected between the second input signal line and the second output signal generating node, a gate of the sixth transistor connected to the second signal generating node, and responding to the output signal of the second output signal generating node.

3. The current sense amplifier according to claim 1, wherein the first power voltage is a ground voltage and the second power voltage is a power supply voltage.

4. The current sense amplifier according to claim 2, wherein each of the first to the sixth transistors is a PMOS transistor.

5. The current sense amplifier according to claim 4, wherein the voltage generating circuit further comprises:
    a first NMOS transistor with a source connected to the common node, a gate and a drain, the gate and the drain connected to the first output signal generating node; and
    a second NMOS transistor with a source connected to the common node, a gate and a drain, the gate and the drain connected to the second output signal generating node.

6. A current sense amplifier, comprising:
    a pair of cross-coupled transistors, a first transistor of the pair being connected between a first input signal line and a first output signal generating node and responding to an output signal of a second output signal generating node, a gate of the first transistor connected to the second output signal generating node, and a second transistor of the pair being connected between a second input signal line and a second output signal generating node, a gate of the second transistor connected to the first output signal generating node, and responding to an output signal of the first output signal generating node, for amplifying a voltage difference between the first output signal generating node and the second output signal generating node;

a constant current circuit connected between the output signal generating nodes and a common node for allowing current to flow between the common node and the first output signal generating node and between the common node and the second output signal generating node in response to a bias voltage;

an enabling circuit for transmitting a first power voltage to the common node by being turned on in response to an enable signal; and a voltage generating circuit for increasing a voltage difference between the first output signal generating node and the second output signal generating node generated by the pair of cross-coupled transistors more by being turned on in response to respective output signals of the first output signal generating node and the second output signal generating node, wherein the voltage generating circuit comprises a third transistor being connected between the first input signal line and the first output signal generating node, a gate of the third transistor connected to the first signal generating node, and responding to the output signal of the first output signal generating node, and a fourth transistor being connected between the second input signal line and the second output signal generating node, a gate of the fourth transistor connected to the second signal generating node, and responding to the output signal of the second output signal generating node.

7. The current sense amplifier according to claim 6, wherein the first power voltage is a ground voltage.

8. The current sense amplifier according to claim 6, wherein each of the first to the fourth transistors is a PMOS transistor.

* * * * *